US012577701B2

(12) United States Patent
Marlar

(10) Patent No.: US 12,577,701 B2
(45) Date of Patent: Mar. 17, 2026

(54) CRYSTAL GROWTH STATION INCLUDING ADJUSTABLE CRYSTAL PULLING ASSEMBLY TO FACILITATE RAPID PRODUCTION

(71) Applicant: Siemens Medical Solutions USA, Inc., Malvern, PA (US)

(72) Inventor: Troy Marlar, Knoxville, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 429 days.

(21) Appl. No.: 18/321,185

(22) Filed: May 22, 2023

(65) Prior Publication Data

US 2024/0392470 A1     Nov. 28, 2024

(51) Int. Cl.
*C30B 15/30*          (2006.01)

(52) U.S. Cl.
CPC .................................... *C30B 15/30* (2013.01)

(58) Field of Classification Search
CPC ................................ C30B 15/30; C30B 35/00
See application file for complete search history.

(56) References Cited

U.S. PATENT DOCUMENTS

| | | | |
|---|---|---|---|
| 3,650,701 A | * | 3/1972 | Forrat ..................... C30B 15/30 117/216 |
| 4,485,072 A | | 11/1984 | Apilat et al. |
| 5,944,892 A | * | 8/1999 | Li ........................... C30B 15/00 117/201 |
| 6,217,803 B1 | | 4/2001 | Uozumi |
| 6,398,656 B1 | | 6/2002 | Michioka et al. |

FOREIGN PATENT DOCUMENTS

| | | | |
|---|---|---|---|
| CN | 201793806 | | 4/2011 |
| JP | 2010095400 A | * | 4/2010 ............. C30B 15/00 |

OTHER PUBLICATIONS

English computer translation of JP-2010095400-A (Year: 2025).*
International Search Report for Corresponding PCT Appln No. PCT/US2024/016997, mailed Jul. 16, 2024.

* cited by examiner

*Primary Examiner* — Matthew J Song

(57)                    ABSTRACT

A crystal growth station includes an adjustable crystal pulling system that implements an adjustment assembly and a motion head coupled to the adjustment assembly. The crystal growth station further includes a moveable furnace chamber configured to be displaced with respect to a docking area of the adjustable crystal pulling system. The adjustment assembly adjusts a position of the motion head with respect to the docking area.

16 Claims, 8 Drawing Sheets

Top View

Side View

Side View

CRYSTAL GROWTH STATION INCLUDING ADJUSTABLE CRYSTAL PULLING ASSEMBLY TO FACILITATE RAPID PRODUCTION

FIELD OF THE INVENTION

The present invention relates generally to crystal growth for nuclear medical imaging, and in particular, to a Czochralski crystal growth station used to facilitate crystal growth and manufacturing.

DESCRIPTION OF RELATED ART

The Czochralski crystal growth process (often referred to simply as the "Czochralski method" or "CZ method") is a widely used process to produce bulk crystals that are used in a wide range of electronic and optical devices. The Czochralski crystal growth process starts with the insertion of a small seed crystal into a melt disposed in a crucible. The seed is then gradually drawn or "pulled" upwards to form a single crystal boule.

BRIEF SUMMARY OF THE INVENTION

According to a non-limiting embodiment, a crystal growth station includes an adjustable crystal pulling system that implements an adjustment assembly and a motion head coupled to the adjustment assembly. The crystal growth station further includes a moveable furnace chamber configured to be displaced with respect to a docking area of the adjustable crystal pulling system. The adjustment assembly adjusts a position of the motion head with respect to the docking area.

According to a non-limiting embodiment, a crystal growth station includes an adjustable crystal pulling system configured to receive a furnace chamber. The adjustable crystal pulling system comprises at least one pillar coupled to a base, a motion head coupled to the at least one pillar, and one or more moveable joints configured to adjust one or both of the motion head and the at least one pillar.

BRIEF DESCRIPTION OF THE DRAWINGS

These and other features, aspects, and advantages of the present invention will become better understood with reference to the following description and appended claims, and accompanying drawings where:

Figure 1B:
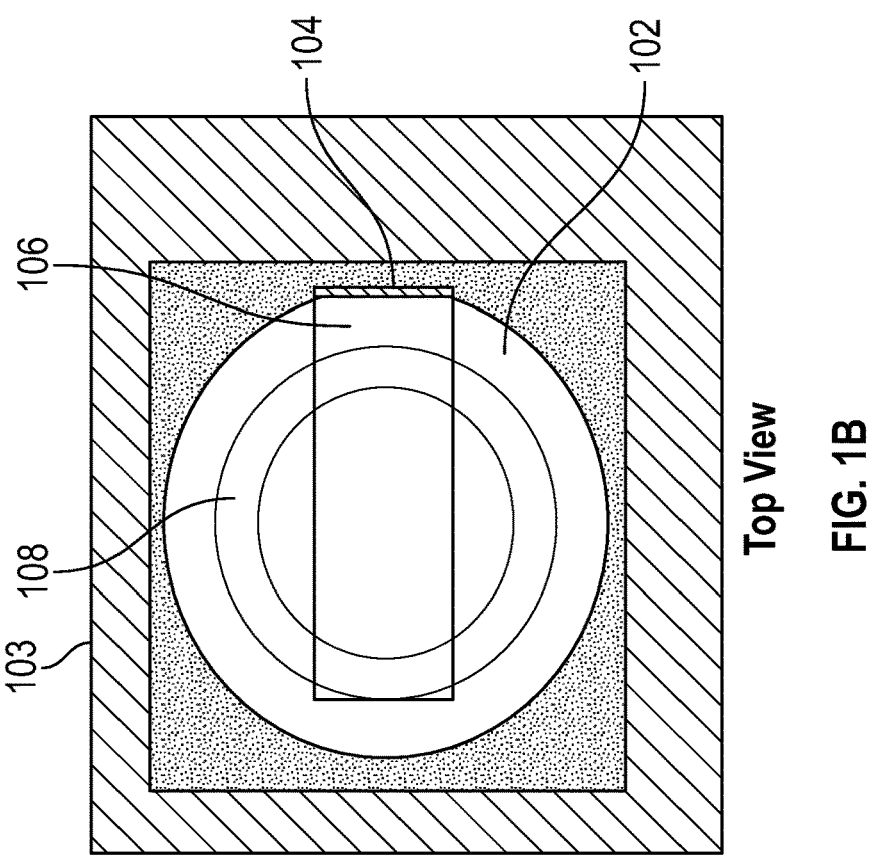
FIG. 1B is a top view of the Czochralski crystal growth station shown in FIG. 1A.

It should be understood that the various embodiments are not limited to the arrangements and instrumentality shown in the drawings.

DETAILED DESCRIPTION OF THE INVENTION

The present invention may be understood more readily by reference to the following detailed description of preferred embodiments of the invention as well as to the examples included therein. All numeric values are herein assumed to be modified by the term "about," whether or not explicitly indicated. The term "about" generally refers to a range of numbers that one of skill in the art would consider equivalent to the recited value (i.e., having the same function or result). In many instances, the term "about" may include numbers that are rounded to the nearest significant figure.

Figure 1A:
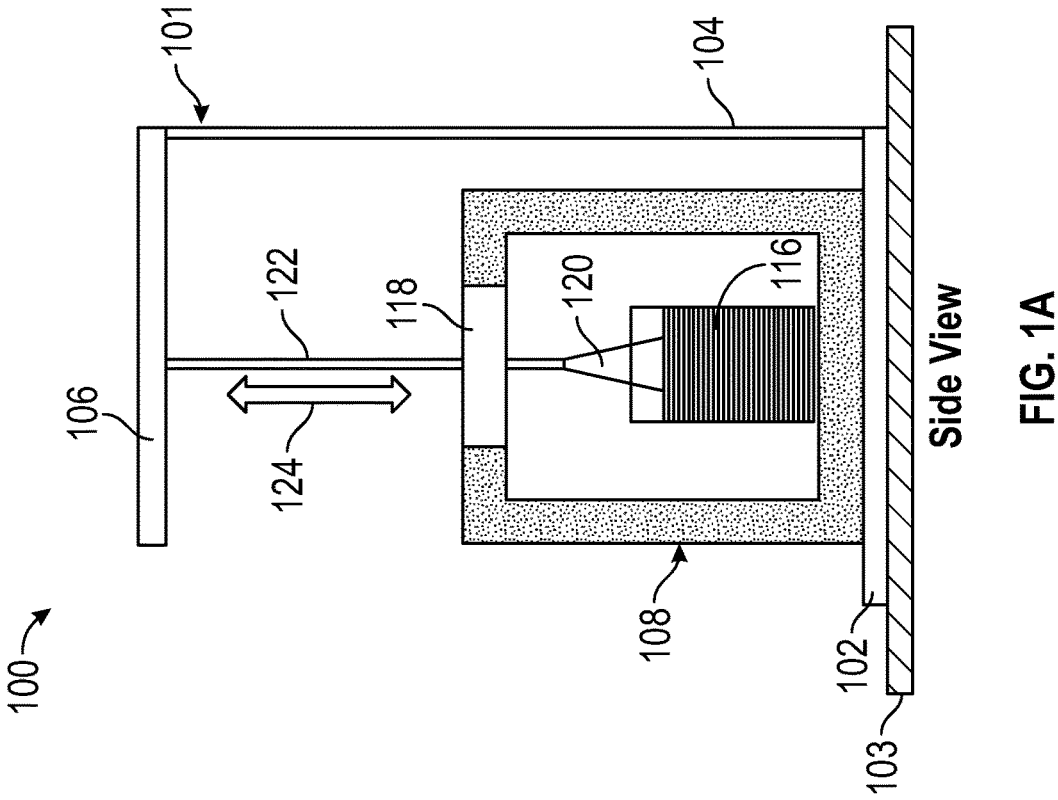
FIG. 1A is a side view of a conventional Czochralski crystal growth station.

FIGS. 1A and 1B depict a conventional Czochralski crystal growth station 100, which includes a furnace chamber 108 and a crystal pulling assembly 101. FIG. 1A is an exemplary side view of a Czochralski crystal growth station, while FIG. 1B is an exemplary top view of a Czochralski crystal growth station. The furnace chamber 108 is disposed on a stationary platform 102 of the crystal pulling assembly 101, which is fixed to a surface (e.g., building floor) and remains stationary throughout the crystal manufacturing process. The furnace chamber 108 is configured to receive a crystal growth chamber 116 that holds a crucible in which raw materials (e.g., in powder form) for manufacturing a crystal are placed and heated. The crystal pulling assembly 101 includes a heating apparatus that employs an induction coil (not shown) for melting and reacting the raw materials (e.g., powders) to form a "melt". The crystal pulling assembly 101 further includes a motion head 106 mounted on a pillar 104. The motion head 106 includes a motor (not shown), which drives a shaft 122 that is rotatably coupled to the motion head 106. The rotating shaft 122 contacts the melt contained in the crucible and rotates while drawing and "pulling" the melt away from the crucible to produce a single crystal boule 120.

In order to pull the melt, the rotating shaft moves upwards along arrow 124. When the crystal boule has reached a desired size, the motion head 106 is broken down and the crystal growth chamber 116 is removed from the furnace chamber 108. Removing of the motion head 108 involves disconnecting the motor from the rotating shaft 122 and moving each of these components out of the path of travel of the crystal growth chamber 116. The crucible is then replenished with raw materials and re-introduced into the furnace chamber 108. The motion head 106 is then reconstructed and the entire process is restarted. The need to breakdown and reconstruction of the motion head 106 is time-consuming and results in a significant increase in production time. It is therefore desirable to reduce the time for removal and replenishing the crystal growth chamber 116/crucible in order to improve production efficiency.

Figure 2A:
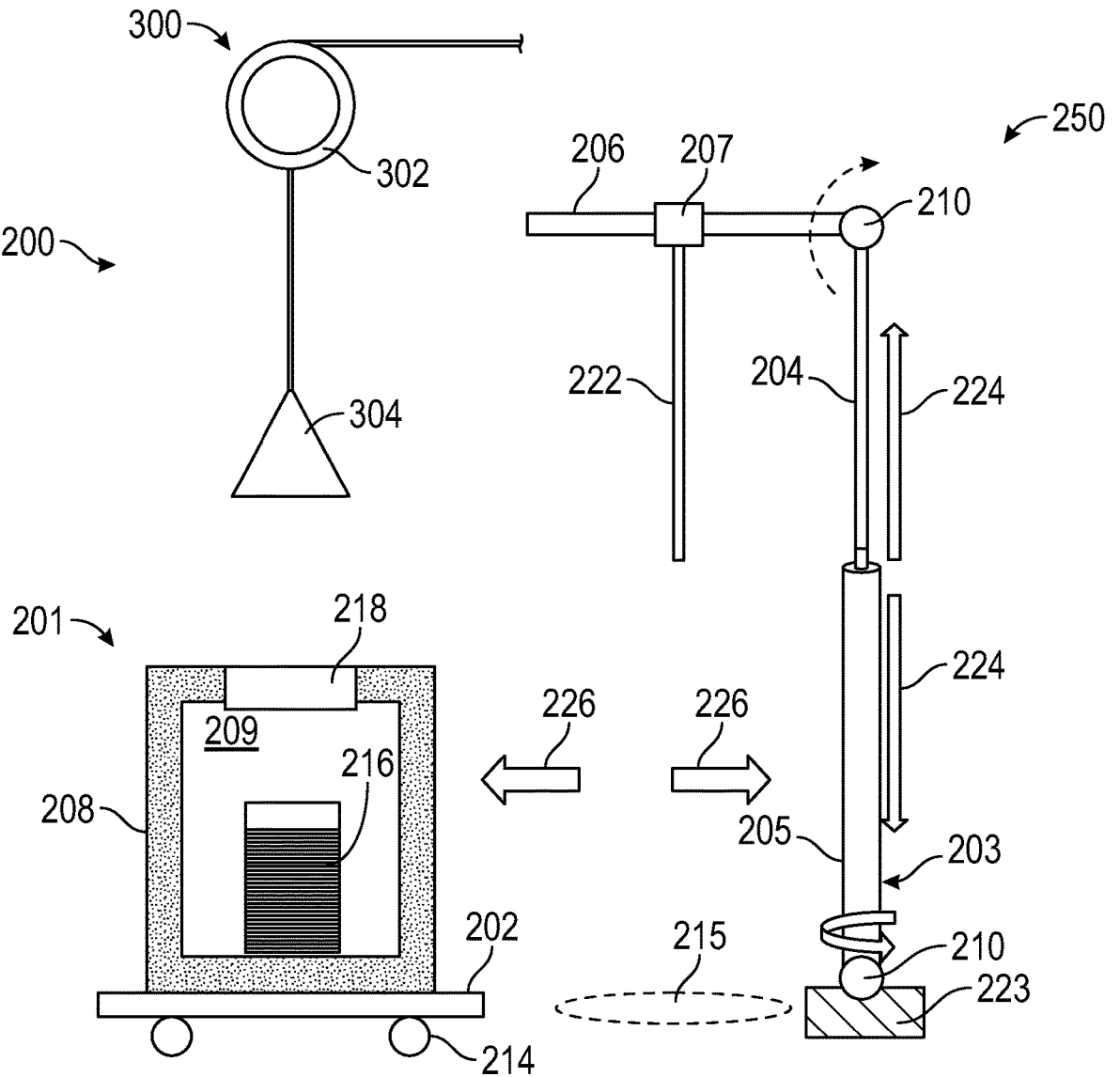
FIG. 2A is a side view of a crystal growth station including an adjustable crystal pulling assembly according to a non-limiting embodiment of the present disclosure.
Figure 2B:
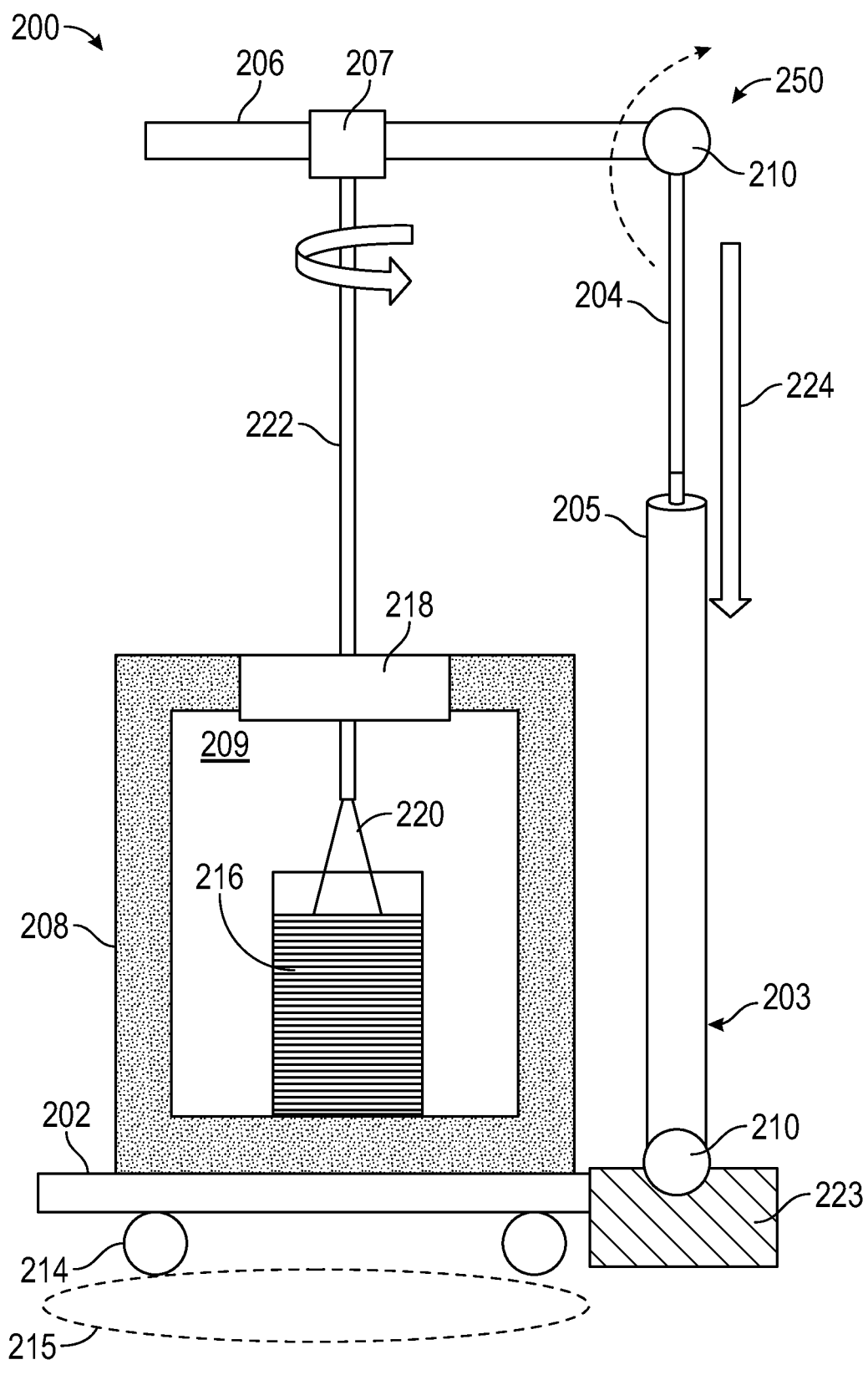
FIG. 2B illustrates the adjustable crystal pulling assembly with a docked moveable furnace chamber according to a non-limiting embodiment of the present disclosure.
Figure 2C:
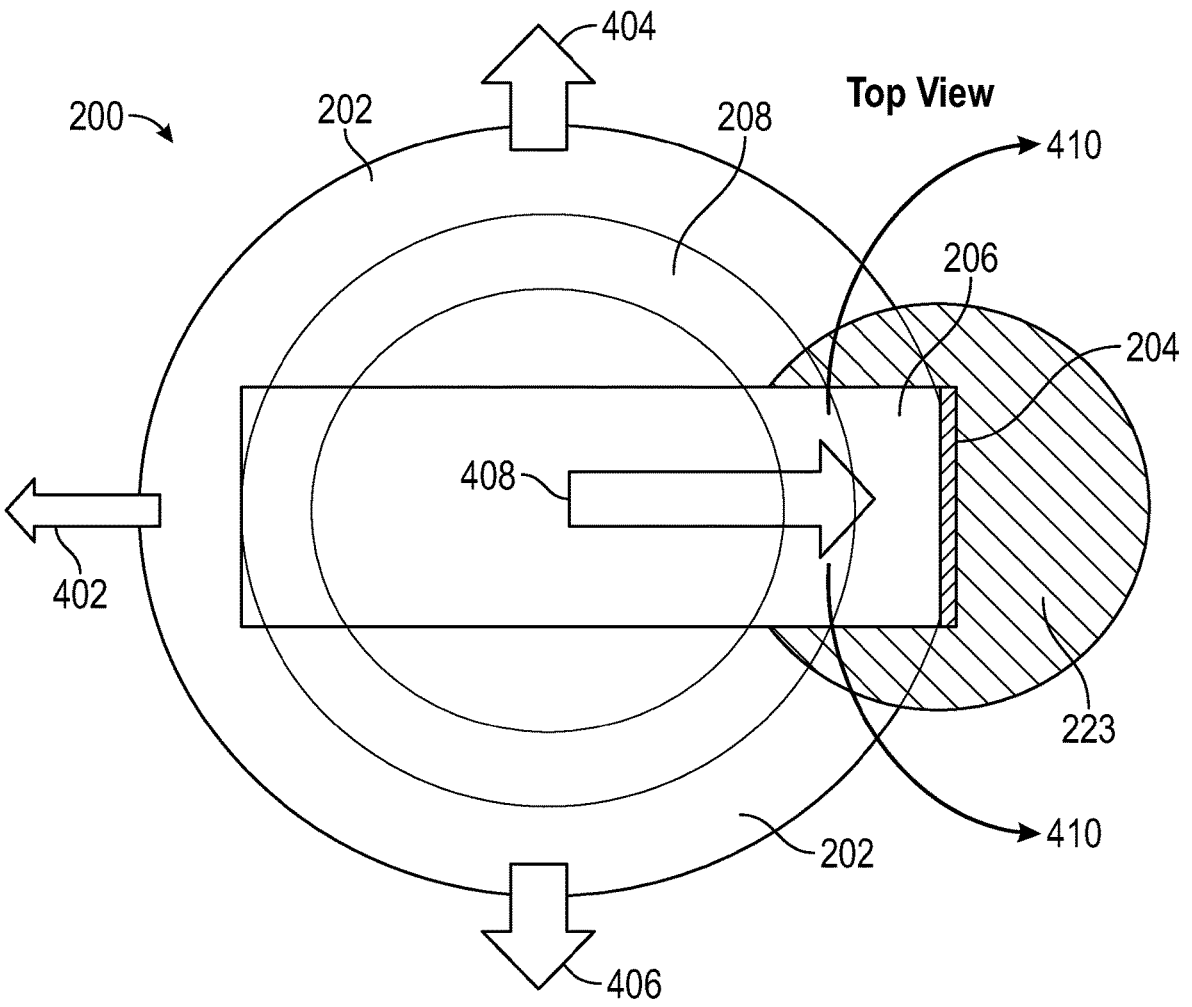
FIG. 2C is a top view of the adjustable crystal pulling assembly and docked moveable furnace chamber shown in FIG. 2B.

With collective reference to FIGS. 2A, 2B and 2C, a crystal growth station 200 is illustrated according to a non-limiting embodiment of the present disclosure. The crystal growth station 200 includes a moveable furnace chamber 201, an adjustable crystal pulling assembly 250, and a chamber removal assembly 300.

The moveable furnace chamber 201 includes a chamber body 208 coupled to a moveable platform 202. According to a non-limiting embodiment, the moveable platform 202 can include one or more wheels 214 that allow the moveable platform 202 to move in all directions (e.g., toward and away from the crystal pulling assembly 250 and/or the chamber removal assembly 300). According to another non-limiting embodiment, the moveable platform 202 is constructed to roll or slide along rails (not shown) disposed on the floor of a room containing the crystal growth station 200. According to another non-limiting embodiment, the moveable platform 202 is constructed to roll or slide along tracks (not shown) disposed on the ceiling of a room containing the crystal growth station 200.

The chamber body 208 surrounds an inner chamber 209 that is accessible via a top opening 218. In one or more non-limiting embodiments, the top opening 218 can include a removable cap that provides access to the inner chamber 209. The inner chamber 209 is configured to receive a crystal growth chamber 216. The crystal growth chamber 216 can be selectively positioned relative to a radio frequency (RF) heater (now shown), which heats the crystal growth chamber 216 during a crystal growth cycle. For simplicity of the figure, known internal components within the crystal growth chamber 216, such as a crucible, ceramic insulation layers, apparatus for introducing and evacuating inert gas within the chamber, etc. are not shown.

The adjustable crystal pulling system 250 is configured to service the moveable furnace chamber 201 docked at a docking area 215. The adjustable crystal pulling system 250 includes a height adjustment assembly 203 and a motion head 206. The height adjustment assembly 203 is fixed to a base 223 and includes an adjustable pillar 204 and a cylinder 205. The adjustable pillar 204 is slidably disposed the cylinder 205 and can be raised or lowered (indicated by arrows 224) with respect to the base 223 and/or the docking area 215. Accordingly, when a crystal boule (not shown) has been produced in the crucible contained in the crystal growth chamber 216, the motion head 206 can be displaced upwards and away from the furnace chamber 208 (as depicted by arrows 224). The movement of the motion head 206 away from the furnace chamber 208 clears a pathway (e.g., represented by arrow 226) for the movement of the furnace chamber 208 away from the motion head 206. In one or more non-limiting embodiments, the adjustable crystal pulling system 250 is configured as a hydraulic jack that raises and lowers the adjustable pillar 204 with respect to the base 223. In another non-limiting embodiment, the adjustable crystal pulling system 250 is configured as a motorized jack or lift, which includes a motor (not shown) that drives the adjustable pillar 204 upward or downward with respect to the base 223. In other non-limiting embodiments, the adjustable crystal pulling system 250 is configured as a linkage assembly that can be manually adjusted to raise and lower the adjustable pillar 204 with respect to the base 223.

The motion head 206 has an end coupled to the adjustable pillar 204 such that it is raised and lowered in response to adjusting the pillar 204. In one or more non-limiting embodiments, the motion head 206 and/or the pillar 204 can include one or more joints 210. For example, the motion head 206 can be coupled to the pillar 204 via a moveable joints 210, and the adjustment assembly 203 can be moveably coupled to the base 223 to swivel thereabout.

The moveable joint 210 can include a hinge joint, ball and socket joint, universal joint, or another type of joint that allows the motion head 206 to move with respect to the pillar 204. In one or more non-limiting embodiments, a motor 207 can be coupled to the adjustment assembly 203 and can swivel the adjustment assembly 203 with respect to the base 223.

The motion head 206 further includes a rotatable pulling shaft 222 coupled to the motor.

Referring to FIG. 2B, for example, the moveable furnace chamber 201 can be conveniently moved into position beneath the motion head 206 an in alignment with the rotatable pulling shaft 222. The pillar 204 can then be lowered such that the pulling shaft 222 makes contact with the melt. Accordingly, the pulling shaft 222 can be rotated while pulling the melt away from the crystal growth chamber 216 to produce the crystal boule.

As described herein, the motion head 206 and/or the moveable furnace chamber 201 can be rapidly displaced and separated from one another. As a result, production time and efficiency of the crystal growth process performed by the crystal growth station 200 can be significantly improved. Referring to FIG. 2C, for example, the moveable furnace chamber 201 can be displaced from the crystal growth station 200 in a wide range of directions as indicated by arrows 402, 404, and 406. In addition, the motion head 206 can be displaced with respect to the moveable furnace chamber 201 in any direction as indicated by arrows 408 and 410. Accordingly, platform 202 can move in a plurality of different directions with respect to the crystal pulling system 250. For example, when the platform 202 is mounted on wheels 214, the furnace chamber 201 can move along on the floor (without any guidance of tracks) in any direction from 404 through 406.

In another embodiment, the motion head 206 can be moved in direction 408 away from the platform 202 and the furnace chamber 208. If the motion head 206 is moved, the furnace chamber 208 and the platform 202 may be retained in their original position and the hoist 302 moved towards the furnace chamber 208 to remove the crystal growth chamber. In an embodiment, both the motion head 206 and the furnace chamber 208 may be moved away from each other. In one or more embodiments, the motion head 206 may also be rotated out of the way of the furnace chamber 208 along directions 410. This is accomplished by rotating or swiveling the crystal pulling system 250 with respect via the base 223.

Figure 2D:
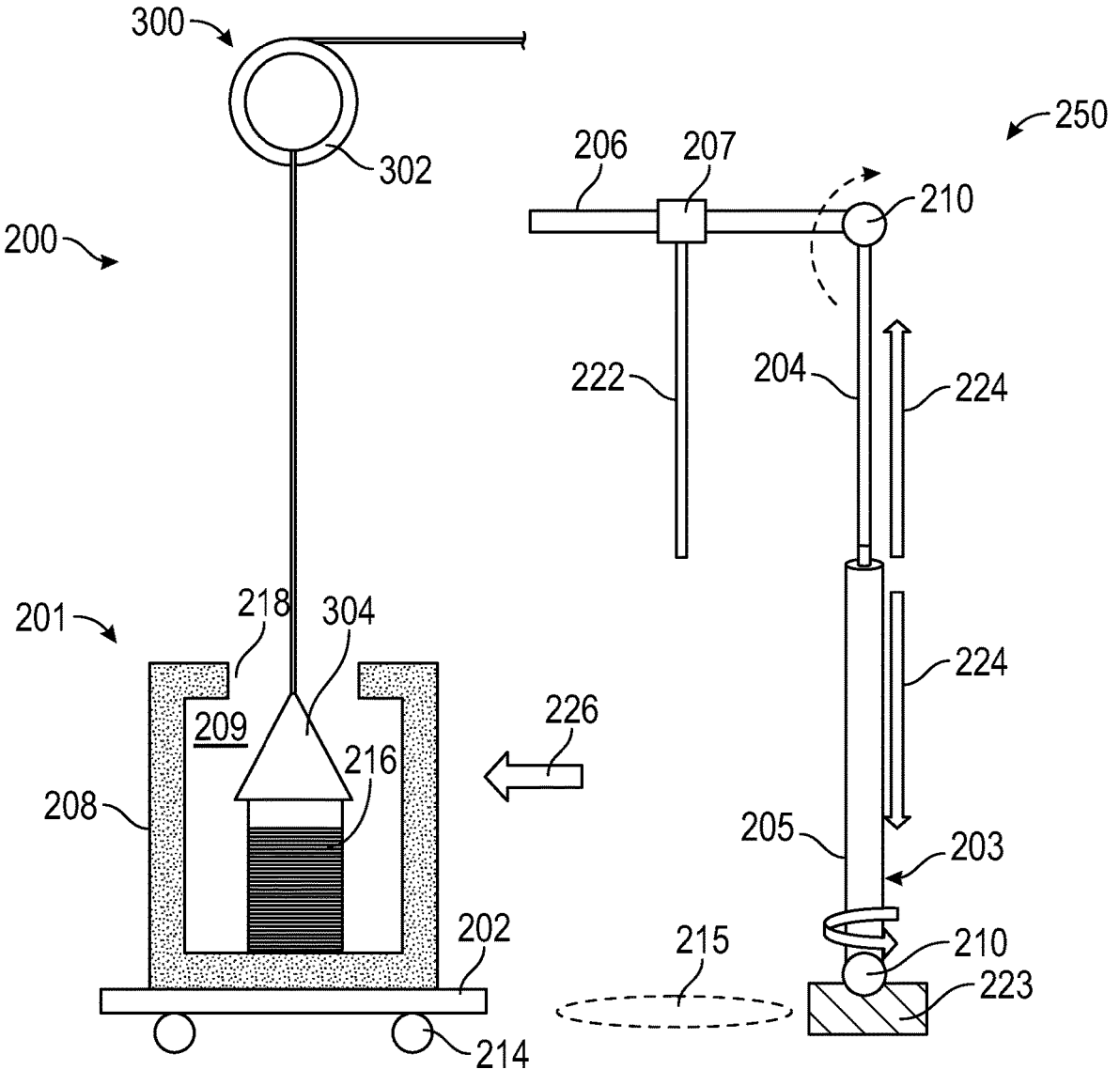
FIG. 2D illustrates the adjustable crystal pulling assembly moved into position with the chamber removal assembly according to a non-limiting embodiment of the present disclosure.

Turning to FIG. 2D, the moveable furnace chamber 201 is shown moved into position beneath the chamber removal assembly 300, which is removes the crystal growth chamber 216 from the inner chamber 209 of the moveable furnace chamber 201. The crane assembly 302 is configured to raise and lower an attachment device 304, which is sized to fit inside the inner chamber 209 and is configured to establish a coupled attachment and detachment with the crystal growth chamber 216. In one or more non-limiting embodiments, the crane assembly 302 can include pulley system or hoist, which is operated according to a crane motor (not shown) and/or manually. The attachment device 304 can be implemented as a grip device 304 which can grip the crystal growth chamber 216. In one or more non-limiting embodiments, the chamber removal assembly 300 can be moveable. For example, the chamber removal assembly 300 can be mounted on tracks laid in the roof of the building. The tracks on the roof can be aligned with the tracks on the floor such that the attachment device 304 can be aligned atop the furnace chamber 208 to remove the crystal growth chamber

Figure 2E:
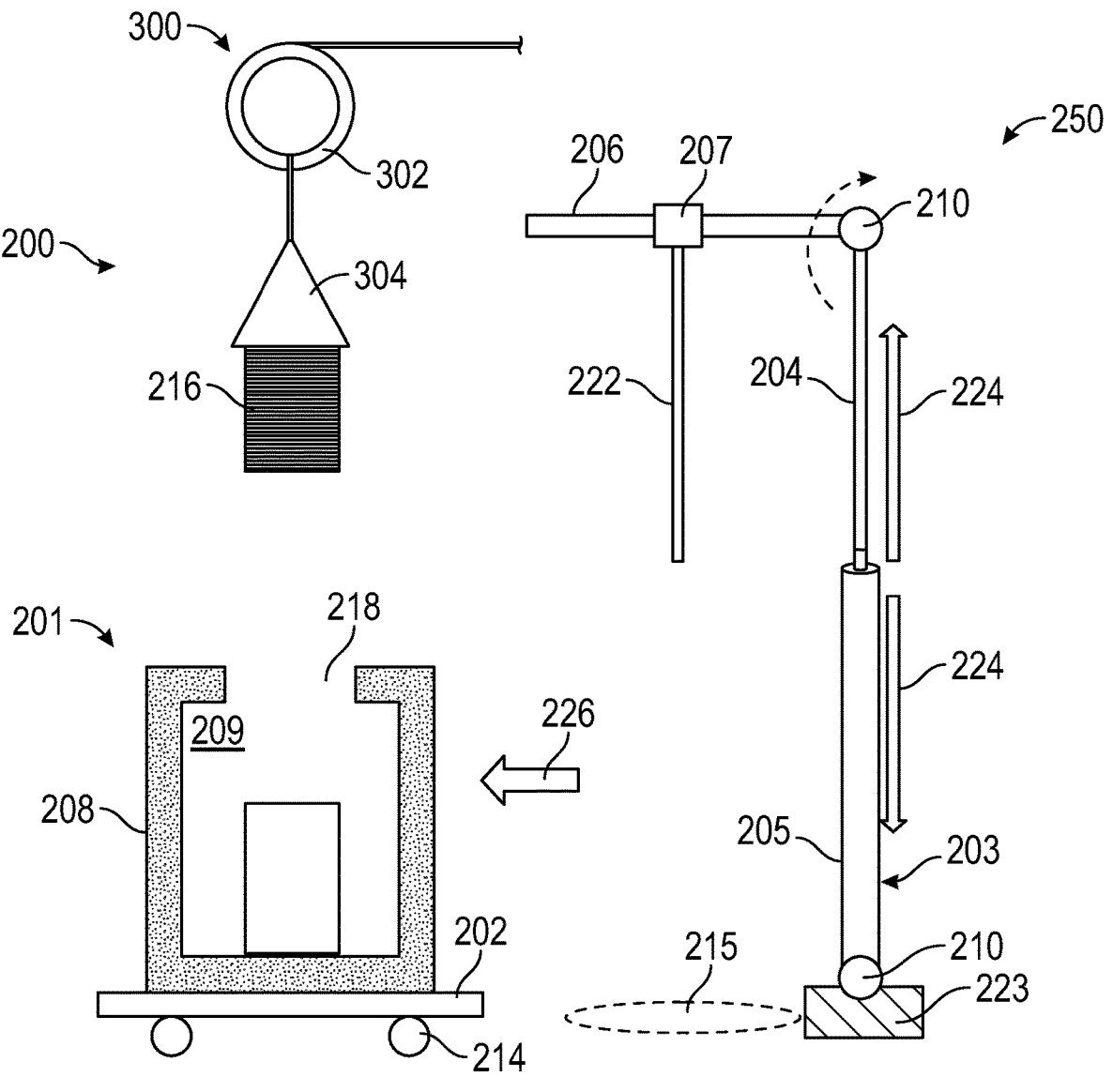
FIG. 2E illustrates the chamber removal assembly removing the crystal growth chamber 216 according to a non-limiting embodiment of the present disclosure.

216. Once the crystal growth chamber 216 is coupled to the attachment device 302, the crane assembly 302 raises the attachment device 304 to remove the crystal growth chamber 216 from within the inner chamber 209 of the moveable furnace chamber 201 as shown in FIG. 2E.

Figure 3A:
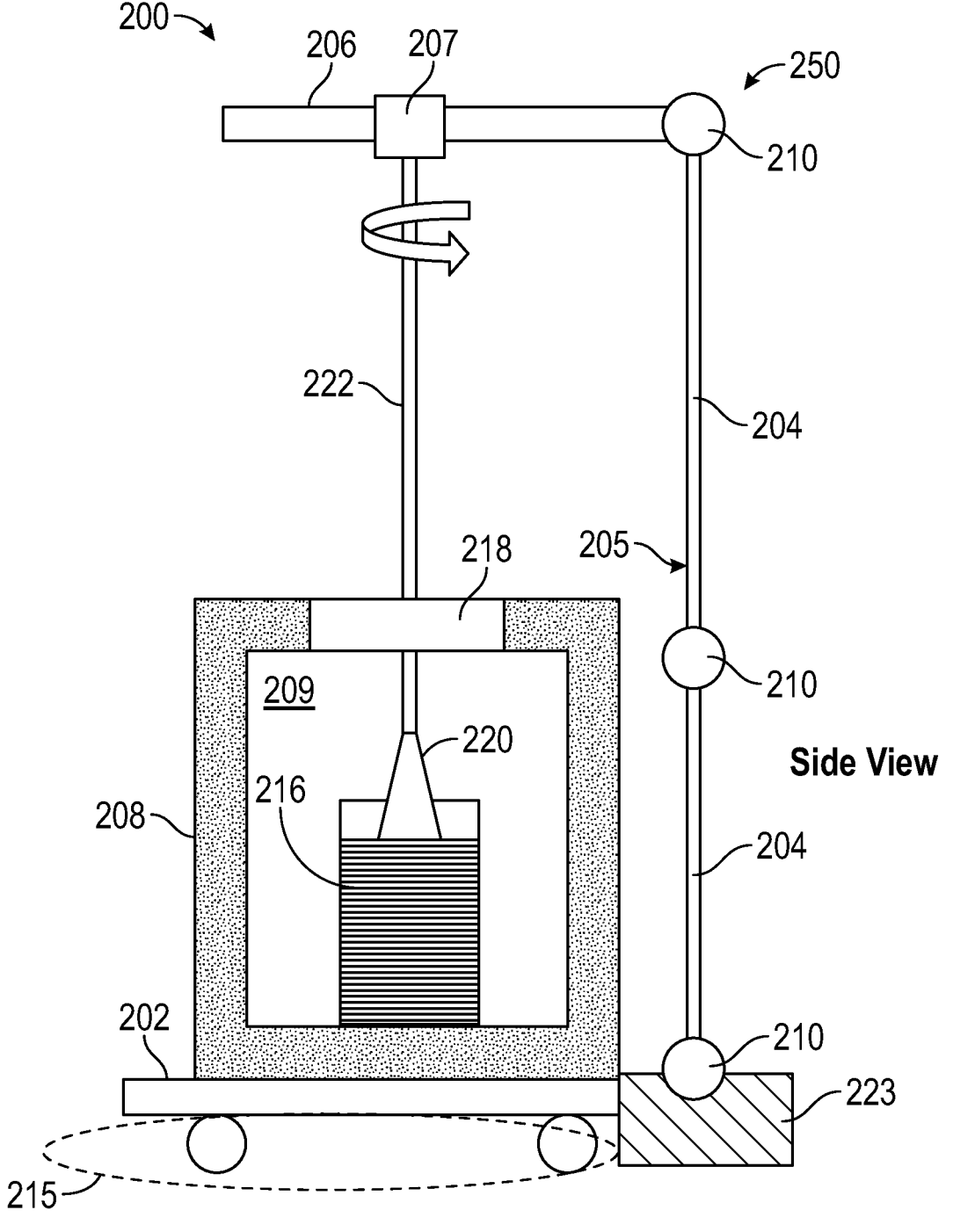
FIG. 3A illustrates a crystal growth station including an adjustable crystal pulling assembly in a first position according to another non-limiting embodiment.
Figure 3B:
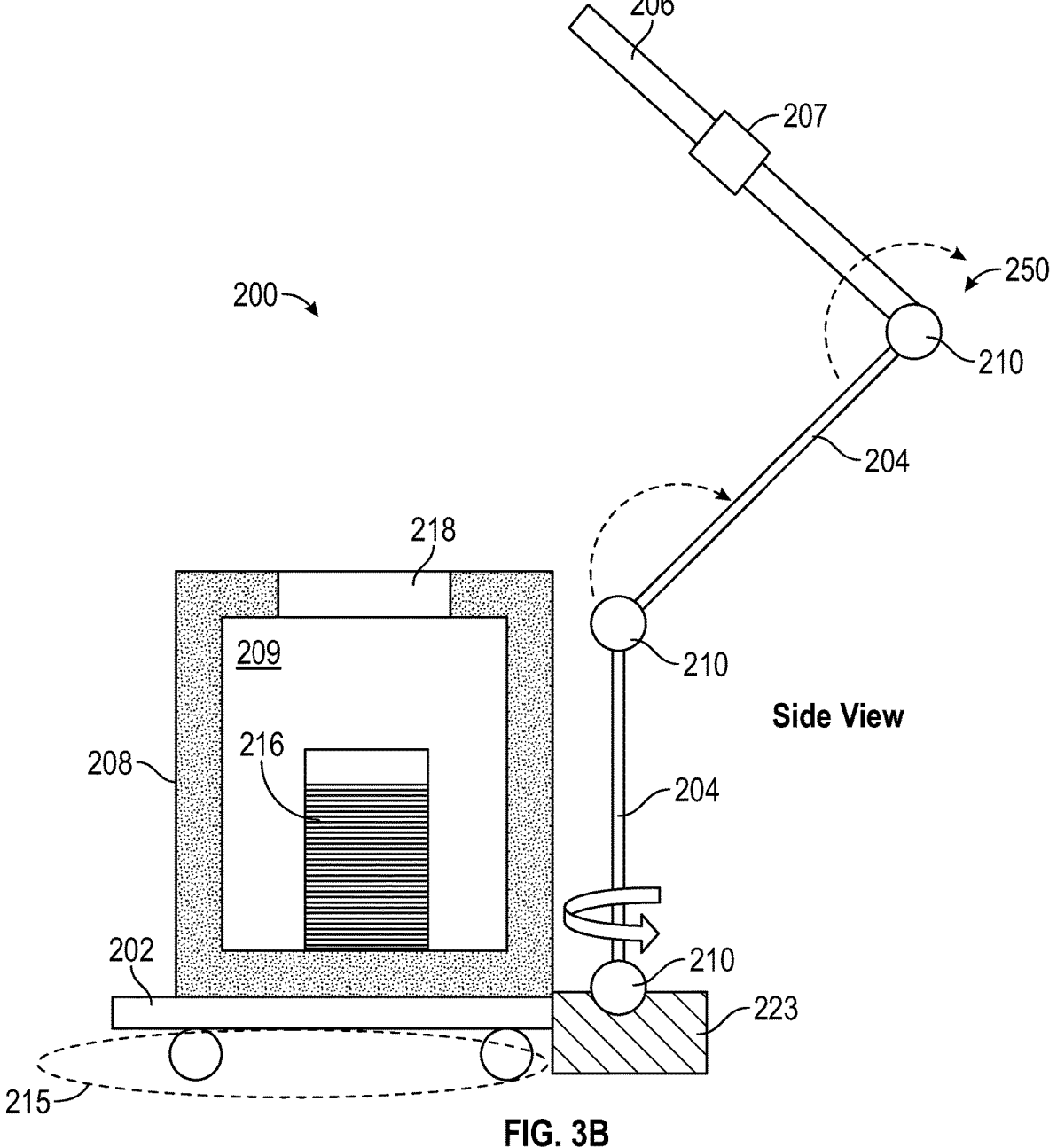
FIG. 3B illustrates the crystal growth station shown in FIG. 3A with the adjustable crystal pulling assembly in a second position according to a non-limiting embodiment.

Turning now to FIGS. 3A and 3B, a crystal growth station 200 including an adjustable crystal pulling assembly 250 is illustrated according to another non-limiting embodiment. As described herein, the adjustable crystal pulling assembly 250 is configured to perform a crystal pulling process to form a crystal boule from a melt contained in the crucible placed in the crystal growth chamber 216, which is disposed in a furnace chamber 201. As described herein, the furnace chamber 201 can hold the crystal growth chamber 216 and can be displaced in any direction with respect to the adjustable crystal pulling assembly 250 so as to improve production time and efficiency of the crystal growth process.

According to one or more non-limiting embodiments, the adjustable crystal pulling assembly 250 includes one or more adjustable pillars 204, a motion head 206 coupled to a pillar 204, and one or more moveable joints 210 configured to adjust one or both of the motion head 206 and one or more of the pillars 204. Although two pillars 204 are shown, it should be appreciated that less or more pillars 204 can be included without departing from the scope of the invention.

According to the non-limiting embodiments described in FIGS. 3A and 3B, a first end of the motion head 206 is moveably coupled to a first end of a first pillar 204 via a first joint 210, a second end of the first pillar 204 is coupled to a first end of a second pillar 204 via a second joint 210, and a second end of the second pillar 204 is coupled to the base 223 via a third joint 210. Although three joints 210 are illustrated, it should be appreciated that more or less joints 210 can be implemented without departing from the scope of the invention. The joints 210 can include any variety of joints that facilitate movement of the motion head 206 and/or pillars 204. In one or more non-limiting embodiments, the joints 210 are implemented as universal joints that facilitate 360 degree movement. Accordingly, the motion head 206 can move 360 degrees with respect to the first pillar 204 via the first joint 210, the first pilar can move 360 degrees with respect to the second pillar 204 via the second joint 210, and the second pilar 204 can move 360 degrees with respect to the base 223 via the third joint 210.

As described herein, the chamber body 208 can be displaced with respect to the adjustable crystal pulling system 250 via the moveable furnace chamber 201. Likewise, the motion head 206 and one or more of the pillars 204 can be displaced and adjusted with respect to the furnace chamber 201. As shown in FIG. 3A, for example, the furnace chamber 201 can be docked at a docking area 215 of the adjustable crystal pulling system 250, and the motion head 206 and/or pillars 204 can be adjusted so that the motion head 206 is positioned over the chamber opening 218. Accordingly, a first end of the rotatable pulling shaft 222 can be coupled to the motor 207 and the second end can be disposed into crystal growth chamber 216 to perform the crystal pulling process.

Once the crystal boule is formed, the motion head 206 and/or one or more of the pillars 204 can be adjusted to provide access to the chamber opening 218 as shown in FIG. 3B. Accordingly, the crystal growth chamber 216 can be extracted from the chamber furnace 208 (e.g., via the chamber removal assembly 300 as shown in FIGS. 2C and 2D).

Although the present invention has been described in considerable detail with reference to certain preferred versions thereof, other versions are possible. Therefore, the spirit and scope of the appended claims should not be limited to the description of the preferred versions contained herein.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C § 112, sixth paragraph. In particular, the use of "step of" in the claims herein is not intended to invoke the provisions of 35 U.S.C § 112, sixth paragraph.

What is claimed is:

1. A crystal growth station comprising:
an adjustable crystal pulling system including:
an adjustment assembly;
a motion head coupled to the adjustment assembly;
a cylinder extending from a first end to a second end, the first end coupled to a base via a universal joint;
an adjustable pillar slidably disposed in the cylinder via the second end and configured to raise or lower with respect to the cylinder and the docking area; and
a moveable furnace chamber configured to be displaced with respect to a docking area of the adjustable crystal pulling system,
wherein the adjustment assembly adjusts a position of the motion head with respect to the docking area.

2. The crystal growth station of claim 1, wherein the adjustable crystal pulling system includes a hydraulic jack configured to raise and lower the adjustable pillar with respect to the docking area.

3. The crystal growth station of claim 1, wherein the adjustable crystal pulling system includes a motorized jack, the motorized jack including a motor that drives the adjustable pillar upward or downward with respect to the docking area.

4. The crystal growth station of claim 1, wherein the adjustable crystal pulling system includes a linkage assembly configured to raise and lower the adjustable pillar with respect to the docking area.

5. The crystal growth station of claim 1, wherein the motion head has an end coupled to the adjustable pillar such that it is raised and lowered in response to adjusting the pillar.

6. The crystal growth station of claim 5, wherein the motion head further includes:
a motion head motor; and
a pulling shaft including a first end rotatably coupled to the motion head motor and an opposing second end configured to be disposed in an inner chamber of the moveable furnace chamber.

7. The crystal growth station of claim 1, wherein the moveable furnace chamber includes a moveable platform having one or more wheels configured to move the moveable platform with respect to the docking area.

8. The crystal growth station of claim 1, further comprising a chamber removal assembly configured to remove a crystal growth chamber from the moveable furnace chamber.

9. The crystal growth station of claim 8, wherein the chamber removal assembly includes a crane assembly configured to raise and lower an attachment device coupled thereto.

10. The crystal growth station of claim 9, wherein the crane assembly is configured to lower the attachment device into the moveable furnace chamber to couple with the crystal growth chamber, and wherein the crane assembly is configured to raise the attachment device while coupled to the remove the crystal growth chamber to remove the crystal growth chamber from within the moveable furnace chamber.

11. A crystal growth station comprising:
an adjustable crystal pulling system configured to receive a furnace chamber, the adjustable crystal pulling system comprising:
a first pillar and a second pillar, each of the first and second pillars coupled to a base;
a motion head including a first end that is moveably coupled to a first end of the first pillar via a first joint; and
one or more moveable joints configured to adjust one or both of the motion head and the at least one pillar, wherein a second end of the first pillar is moveably coupled to a first end of the second pillar via a universal joint, and wherein the first pilar moves 360 degrees with respect to the second pillar via the universal joint.

12. The crystal growth station of claim 11, wherein the first joint is a universal joint, and wherein the motion head moves 360 degrees with respect to the first pillar via the first joint.

13. The crystal growth station of claim 11, wherein a second end of the first pillar is coupled to a first end of a second pillar, and wherein a second end of the second pillar is coupled to the base.

14. The crystal growth station of claim 13, wherein the second end of the second pillar is coupled to the base via a third joint.

15. The crystal growth station of claim 14, wherein the third joint is a universal joint, and wherein the second pilar moves 360 degrees with respect to the base via the third joint.

16. The crystal growth station of claim 11, wherein the furnace chamber is a moveable furnace chamber including a chamber body coupled to a moveable platform, and wherein the chamber body can be displaced with respect to the adjustable crystal pulling system via the moveable platform.

* * * * *